United States Patent
Holden et al.

(10) Patent No.: US 8,883,615 B1
(45) Date of Patent: Nov. 11, 2014

(54) APPROACHES FOR CLEANING A WAFER DURING HYBRID LASER SCRIBING AND PLASMA ETCHING WAFER DICING PROCESSES

(71) Applicants: James Matthew Holden, San Jose, CA (US); Wei-Sheng Lei, San Jose, CA (US); James S. Papanu, San Rafael, CA (US); Ajay Kumar, Cupertino, CA (US)

(72) Inventors: James Matthew Holden, San Jose, CA (US); Wei-Sheng Lei, San Jose, CA (US); James S. Papanu, San Rafael, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/455,506

(22) Filed: Aug. 8, 2014

Related U.S. Application Data

(63) Continuation of application No. 14/201,452, filed on Mar. 7, 2014.

(51) Int. Cl.

| | | |
|---|---|---|
| *H01L 21/00* | (2006.01) | |
| *H01L 21/78* | (2006.01) | |
| *H01L 23/544* | (2006.01) | |
| *H01L 23/00* | (2006.01) | |
| *H01L 21/268* | (2006.01) | |
| *H01L 21/3065* | (2006.01) | |
| *H01L 23/28* | (2006.01) | |

(52) U.S. Cl.
CPC .............. *H01L 21/78* (2013.01); *H01L 23/544* (2013.01); *H01L 23/562* (2013.01); *H01L 21/268* (2013.01); *H01L 21/3065* (2013.01); *H01L 23/28* (2013.01)
USPC ........... 438/462; 438/113; 438/114; 438/613; 438/465; 257/723; 257/737; 257/738

(58) Field of Classification Search
USPC ............. 438/33, 42, 107, 108, 110, 113, 114, 438/127, 462, 465, 460, 612, 613; 257/723, 257/737, 738, 778, 782, 783, 787, 788, 789, 257/790, 795
See application file for complete search history.

(56) References Cited

U.S. PATENT DOCUMENTS

| | | |
|---|---|---|
| 4,049,944 A | 9/1977 | Garvin et al. |
| 5,593,606 A | 1/1997 | Owen et al. |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al "Water-Soluble Sacrificial Layers for Surface Micromachining", www.small-journal.com, 2005, 1, No. 7, 7 pgs.

(Continued)

*Primary Examiner* — Thanh Y Tran
(74) *Attorney, Agent, or Firm* — Blakely Sokoloff Taylor Zafman LLP

(57) ABSTRACT

Approaches for cleaning a wafer during hybrid laser scribing and plasma etching wafer dicing processes are described. In an example, a method of dicing a semiconductor wafer having a front surface having a plurality of integrated circuits thereon involves forming an underfill material layer between and covering metal pillar/solder bump pairs of the integrated circuits. The method also involves forming a mask layer on the underfill material layer. The method also involves laser scribing mask layer and the underfill material layer to provide scribe lines exposing portions of the semiconductor wafer between the integrated circuits. The method also involves removing the mask layer. The method also involves, subsequent to removing the mask layer, plasma etching the semiconductor wafer through the scribe lines to singulate the integrated circuits, wherein the second insulating layer protects the integrated circuits during at least a portion of the plasma etching. The method also involves, subsequent to the plasma etching, thinning but not removing the underfill material layer to partially expose the metal pillar/solder bump pairs of the integrated circuits.

19 Claims, 13 Drawing Sheets

(56) References Cited

U.S. PATENT DOCUMENTS

| | | | |
|---|---|---|---|
| 6,057,180 A | 5/2000 | Sun et al. | |
| 6,174,271 B1 | 1/2001 | Kosmowski | |
| 6,306,731 B1 | 10/2001 | Igarashi et al. | |
| 6,407,363 B2 | 6/2002 | Dunsky et al. | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,071,572 B2 * | 7/2006 | Kumamoto | 257/778 |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,811,903 B2 * | 10/2010 | Grigg et al. | 438/459 |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,927,973 B2 | 4/2011 | Haji et al. | |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2005/0236704 A1 * | 10/2005 | Wu | 257/678 |
| 2006/0043535 A1 | 3/2006 | Hiatt | |
| 2006/0205182 A1 | 9/2006 | Soejima | |
| 2009/0255911 A1 | 10/2009 | Krishnaswami et al. | |
| 2011/0312157 A1 | 12/2011 | Lei et al. | |
| 2013/0280861 A1 * | 10/2013 | Ma et al. | 438/107 |
| 2014/0144690 A1 * | 5/2014 | Pares | 174/261 |

FOREIGN PATENT DOCUMENTS

| | | |
|---|---|---|
| JP | 200144126 | 5/2001 |
| JP | 2001127011 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etching With Edge, Side and Back Protection", U.S. Appl. No. 61/491,693, filed May 31, 2011 24 pgs.

Lei, et al., U.S. Appl. No, 14/060,005 entitled "Maskless Hybrid Laser Scribing and Plasma Etching Water Dicing Process" filed on Oct. 22, 2013, 49 pgs.

Lei, et al., U.S. Appl. No. 13/947,890 entitled "Wafer Dicing With Wide Kerf by Laser Scribing and Plasma Etching Hybrid Approach" filed on Jul. 22, 2013, 49 pgs.

* cited by examiner $$I = \frac{E_p}{\pi \cdot w_0^2 \cdot \tau}$$

Intensity — $I$
Pulse Energy — $E_p$
Beam Radius — $w_0$
Pulse Width — $\tau$

APPROACHES FOR CLEANING A WAFER DURING HYBRID LASER SCRIBING AND PLASMA ETCHING WAFER DICING PROCESSES

CROSS-REFERENCE TO RELATED APPLICATIONS

This application is a continuation of U.S. patent application Ser. No. 14/201,452, filed on Mar. 7, 2014, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110>direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

One or more embodiments described herein are directed to approaches for cleaning a wafer during hybrid laser scribing and plasma etching wafer dicing processes.

In an embodiment, a method of dicing a semiconductor wafer having a front surface having a plurality of integrated circuits thereon involves forming an underfill material layer between and covering metal pillar/solder bump pairs of the integrated circuits. The method also involves forming a mask layer on the underfill material layer. The method also involves laser scribing mask layer and the underfill material layer to provide scribe lines exposing portions of the semiconductor wafer between the integrated circuits. The method also involves removing the mask layer. The method also involves, subsequent to removing the mask layer, plasma etching the semiconductor wafer through the scribe lines to singulate the integrated circuits, wherein the second insulating layer protects the integrated circuits during at least a portion of the plasma etching. The method also involves, subsequent to the plasma etching, thinning but not removing the underfill material layer to partially expose the metal pillar/solder bump pairs of the integrated circuits.

In an embodiment, a method of dicing a semiconductor wafer having a front surface having a plurality of integrated circuits thereon involves forming a first insulating layer between lower portions of metal pillar/solder bump pairs of the integrated circuits. The method also involves forming a second insulating layer on the first insulating layer, between and covering upper portions of the metal pillar/solder bump pairs. The method also involves laser scribing the first and second insulating layers to provide scribe lines exposing portions of the semiconductor wafer between the integrated circuits. The method also involves plasma etching the semiconductor wafer through the scribe lines to singulate the integrated circuits, wherein the second insulating layer protects the integrated circuits during at least a portion of the plasma etching. The method also involves, subsequent to the plasma etching, thinning but not removing the second insulating layer to partially expose the metal pillar/solder bump pairs of the integrated circuits.

In an embodiment, an apparatus includes a substrate carrier having a tape frame surrounding a dicing tape. A semiconductor wafer is disposed on a portion of the dicing tape. The semiconductor wafer has a front surface having a plurality of integrated circuits thereon. A first insulating layer is disposed between lower portions of metal pillar/solder bump pairs of the integrated circuits. A second insulating layer is disposed on the first insulating layer, between and covering upper portions of the metal pillar/solder bump pairs.

In an embodiment, a method of dicing a semiconductor wafer having a front surface having a plurality of integrated circuits thereon involves providing the semiconductor wafer having a first insulating layer disposed between lower portions of metal pillar/solder bump pairs of the integrated circuits, having a second insulating layer disposed on the first insulating layer, between and covering upper portions of the metal pillar/solder bump pairs, and having scribe lines disposed in the first and second insulating layers exposing portions of the semiconductor wafer between the integrated circuits. The method also involves plasma etching the semiconductor wafer through the scribe lines to singulate the integrated circuits, wherein the second insulating layer protects the integrated circuits during at least a portion of the plasma etching. The method also involves, subsequent to the plasma etching, thinning but not removing the second insulating layer to partially expose the metal pillar/solder bump pairs of the integrated circuits.

DETAILED DESCRIPTION

Figure 1A:
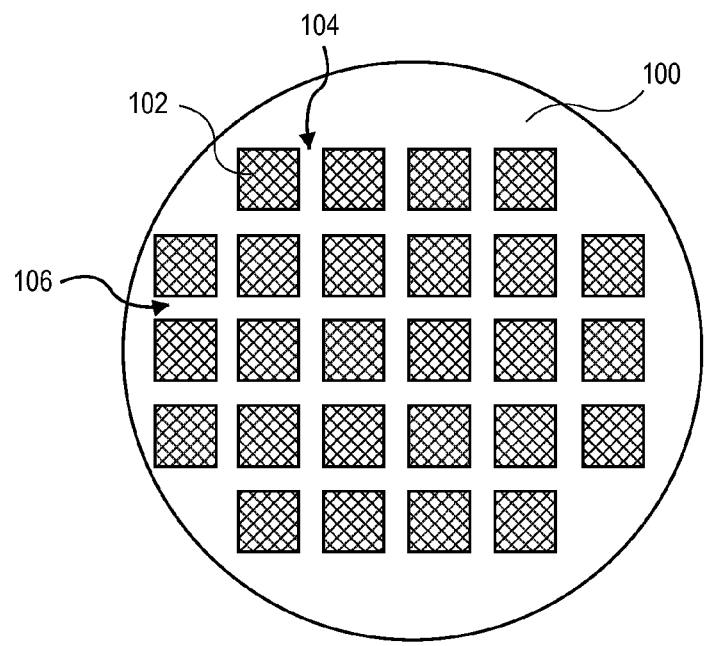
FIG. 1A illustrates a top plan of a conventional semiconductor wafer to be diced.

Approaches for cleaning a wafer during hybrid laser scribing and plasma etching wafer dicing processes are described. In the following description, numerous specific details are set forth, such as laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a masked or maskless thick passivation layer, organic and/or inorganic dielectric layers, and device layers. The laser etch process may then be terminated upon exposure of, or partial etch of, the underlying wafer or substrate. The plasma etch portion of the dicing process may then be employed to etch through the bulk of the wafer or substrate, such as through bulk single crystalline silicon, to yield die or chip singulation or dicing. In particular embodiments herein, a method to dice wafers with a masked or maskless thick passivation polymer layer are described. In an embodiment, an underfill material is included between a dicing mask and a thick passivation polymer layer throughout the dicing process. In one such embodiment, the underfill material layer is applied before dicing and retained on singulated dies as a component of a final structure which may be suitable for subsequent packaging.

More generally, one or more embodiments described herein pertain to the semiconductor industry and, specifically, to processes for dicing integrated circuit devices ("chips") from semiconductor wafers prior to packaging them. To provide context, the trend to product miniaturization has led to increasing packaging densities through stacking chips on top of one another, which may be referred to as "3D packaging." The chips are generally thinned and very delicate and, since the resulting circuitry is very dense, heat dissipation away from the devices becomes an important issue. Excess heat can lead to premature failure or performance degradation of the stacked devices either through expansion mismatch due to temperature gradients from the top to the bottom of the stack, or directly, through overheating of the transistor-based circuitry on the individual chips. Since stacked chips are connected to potential heat sinks through neighboring chips in the stack, it becomes extremely important to create excellent thermal 'shorts' from chip to chip in the stack. When one chip is stacked on top of another, a material referred to as an "under-fill layer" is implemented on the top of the chips (device side) to create this thermal short and also to provide a mechanically stable connection between the stacked chips. Such an under-fill material should generally have (1) very low electrical conductivity, (2) high thermal conductivity, (3) coefficient of thermal expansion closely matched to the chip bulk material e.g. silicon, (4) good adhesion to the various passivation layers and molding compounds that are used on the tops and bottoms of the chips e.g. silicon nitrides, oxides, polyimides, and (5) advantageous rheology allowing formability around the topology of the pillars and bumps found on the device side of the chip without leaving voids. Examples of suitable commercially available materials for the underfill layer include B-staged epoxy such as Intervia™ or Cyclotene™ both by Dow Chemical, polyimides such as Pimel™ available from Asahi KASEI, polybenzoxazoles such as Sumiresin™ available from Sumitomo Bakelite. Many other materials are also available.

Providing further context, previous approaches for applying an under-fill layer have included: (1) capillary action flow of an under-fill curable liquid between two chips of the already assembled stack, (2) application of a "hot melt" material to the top or bottom of a chip prior to stacking which flows when heated, and (3) application of a dry laminate to the top of the finished chip prior to stacking. However, the capillary action flow approach often encounters difficulties in balancing the required wettability of the chip/flow material interface against the force that the capillary action places on the thinned and very delicate chips. Meanwhile, hot melt approaches are still being investigated and have not been optimized. Another method may be the application of a dry laminate, where a dry film is applied in a physical manner to the top of the finished chip prior to stacking, but following singulation.

By contrast, in accordance with one or more embodiments described herein, a physical application approach to introducing an underfill material layer is implemented, but prior to die singulation. This method is commonly referred to as "wafer level underfill". In one such embodiment, the implementation involves physically rolling a bilayer tape onto the surface of a wafer prior to dicing whereby the bottom layer of the bilayer tape flows around the copper bumps and pillars and the top layer acts as a carrier and is peeled away. A reveal process may be performed where the laminate is thinned from the top, e.g., by plasma ashing, to reveal the contact areas of the bumps. When such a reveal process is performed by an ashing process (e.g., a dry oxygen plasma etch plus potentially other reactant gasses such as ammonia), the process may be advantageously clean, allowing for improved yield and reliability.

More specifically, embodiments include laser and plasma etching wafer dicing processing including dicing of a molding compound, which is often a polyimide, that is applied after passivation to fill the region between the pillars and, possibly, to cover the corresponding bumps. The wafer is then processed by (1) laser etching through the polyimide molding, passivation layers, device layers, and into the (silicon) substrate, (2) plasma etching through the substrate to affect chip singulation, and then (3) additionally etch trimming the polyimide to reveal the bumps for contact. A dry cleaning operation may be added to ensure the bump contacts are clean in the event that the laser process creates debris and re-deposition onto the surface of the wafer, e.g. recast, particles, and films, which may include materials such as copper and large particles, which cannot be removed by a dry clean technique like oxygen and ammonia ashing. In further embodiments, in addition to the (e.g., polyimide) molding compound, a material that is generally part of the final device and resides on the top of the device prior to dicing, is also included. Such an additional material layer may be included as both an etch mask for plasma singulation and as a final retained layer in a packaged semiconductor die. In one such embodiment, a dry laminate under-fill layer is included on a thick passivation or molding layer as part of the stack for dicing. Since the dry laminate under-fill may cover the bumps, the layer may also be double purposed as an etch mask.

However, yet further embodiments include use of an additional dicing mask on a molding/passivation and underfill material stack for improving cleanliness of the process. For example, in one such embodiment, issues relating to the formation of debris from the laser etch process, namely, the recast, the particles, and the re-deposited films may be addressed by use of a disposable mask layer. In one such embodiment, a method involves, dry laminating an underfill material on integrated circuits to cover the bumps of the integrated circuits, spinning on a thin water soluble layer, laser scribing through the mask, the underfill/molding layers, passivation layers and device layers into the substrate, washing away the mask material along with debris ejected by the laser scribing process, drying the wafer, etching to singulate dies while relying on the dry laminate underfill to protect the devices. At the end of the etch, the method involves carefully etch revealing to be sure the bumps are revealed, clean and ready for pick. Advantageously, in this embodiment, the thin mask generally prevents laser debris from impacting the cleanliness of all processes subsequent to the washing and drying step and thereby specifically enables implementation of a dry etch reveal which is ill-suited to dealing with large particle debris ejected by a laser scribing process and therefore further enhancing cleanliness of the contacts thus increasing device reliability and performance.

Figure 1B:
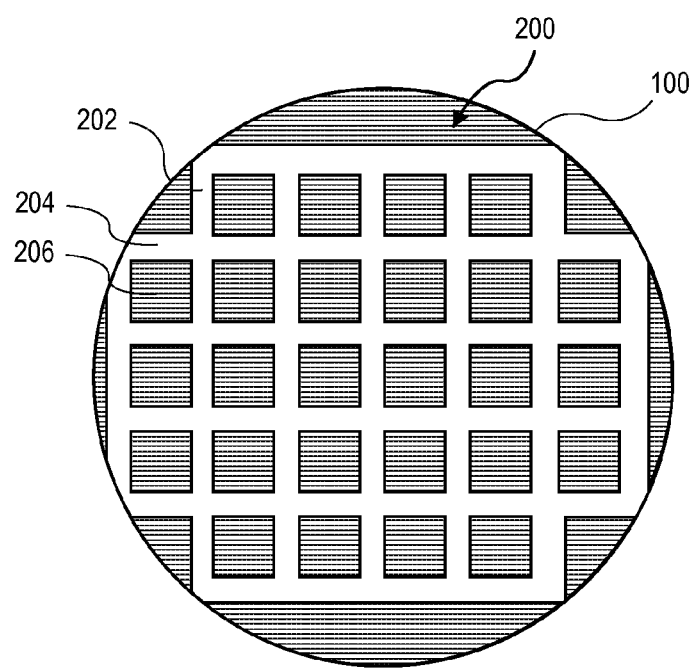
FIG. 1B illustrates a top plan of a semiconductor wafer having a masked or maskless thick passivation layer following a laser scribing process but prior to a plasma etching process, in accordance with an embodiment of the present invention.

Thus, in an aspect of the present invention, a combination of laser scribing and plasma etching may be used to dice a semiconductor wafer into singulated integrated circuits. However, certain embodiments are directed to a masked or maskless process, wherein a passivation layer or a stack including a passivation layer is used to protect bumps of the IC during the dicing process. In one case, a stack including an underfill material layer is used. To provide further context, FIG. 1A illustrates a top plan of a conventional semiconductor wafer to be diced. FIG. 1B illustrates a top plan of a semiconductor wafer having a masked or maskless thick passivation layer following a laser scribing process but prior to a plasma etching process, in accordance with an embodiment of the present invention.

Referring to FIG. 1A, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits and are designed as locations along which the wafer will be diced. Some embodiments of the present invention involve the use of a combination laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 1B, in accordance with an embodiment directed to a maskless approach, the semiconductor wafer 100 has a thick passivation layer 200 (and, possibly, a masked or maskless underfill material layer on the passivation layer). The thick passivation layer 200 and a portion of the semiconductor wafer 100 are patterned with a laser scribing process to define the locations (e.g., gaps 202 and 204) along the streets 104 and 106 where the semiconductor wafer 100 will be diced. The integrated circuit regions of the semiconductor wafer 100 are covered and protected by the thick passivation layer 200 or by a stack including the thick passivation layer 200. In the latter case, a stack may include a masked or maskless underfill material layer on the thick passivation layer. The regions 206 of the thick passivation layer 200 (or stack) are positioned such that during a subsequent etching process, the integrated circuits are not degraded by the etch process. Horizontal gaps 204 and vertical gaps 202 are formed between the regions 206 to define the areas that will be etched during the etching process to finally dice the semiconductor wafer 100.

More particular embodiments are directed to singulation consideration for a new generation of DRAM memory chips that bear 50 micron or higher bumps for interconnects and having a thick polyimide layer surrounding the bumps. The thick polyimide layer is included to provide mechanical support, electrical isolation and passivation, with only the bump top surface exposed for soldering. However, such a thick passivation layer must be accounted for in a dicing scheme. In an embodiment, a wafer is first provided with a passivation layer having an initial thickness above, and covering, the bumps and then scribed with a laser to remove all the layers above the Si substrate. The laser scribing is followed by plasma dicing to remove exposed portions of the Si substrate. The thick polyimide passivation layer is then thinned by ashing to a final thickness approximately in the range of 35-50 microns to provide access to the metal bumps.

Figure 2A:
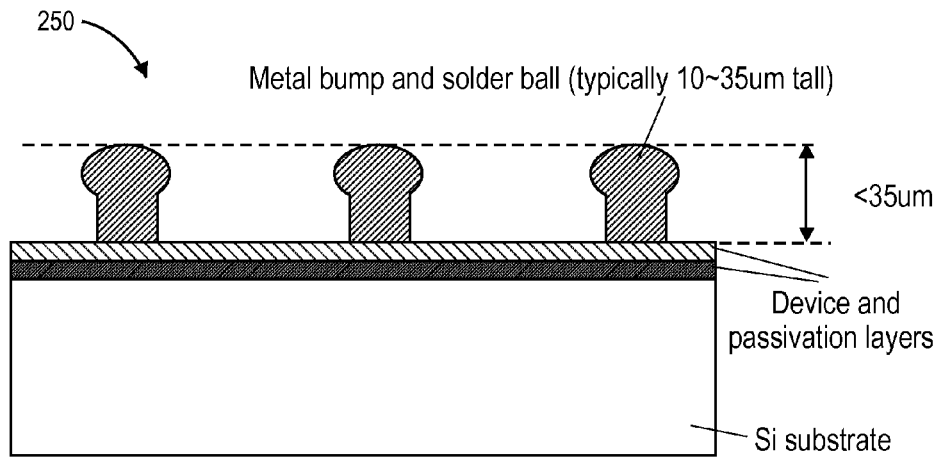
FIG. 2A illustrates a cross-sectional view of a portion of a state-of-the-art DRAM wafer.
Figure 2B:
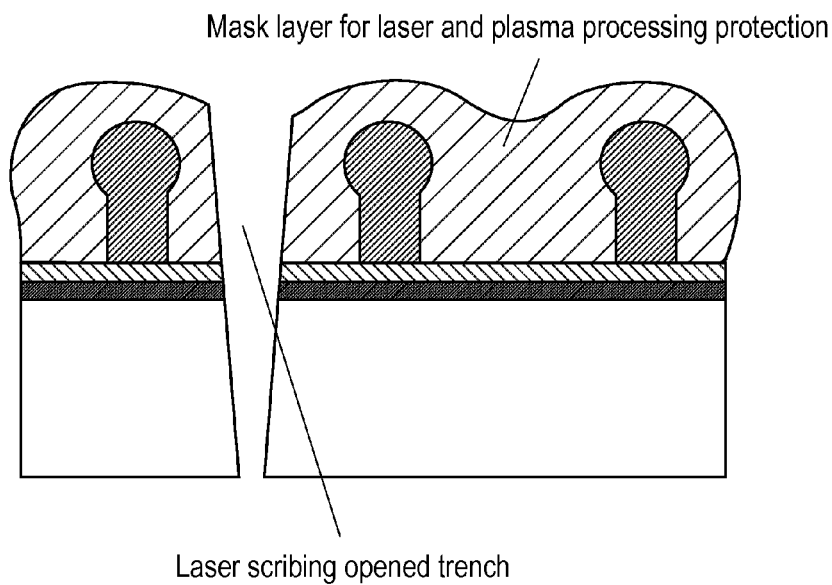
FIG. 2B illustrates a cross-sectional view representing an operation in a dicing process for a portion of the state-of-the-art DRAM wafer of FIG. 2A.

To provide thorough context, FIG. 2A illustrates a cross-sectional view of a portion of a state-of-the-art DRAM wafer. Referring to FIG. 2A, wafer 250 has thereon DRAM memory chips having metal bumps and solder balls that are typically 10-35 um tall. The DRAM memory chips also include device and passivation layers, all disposed on a Si substrate. FIG. 2B illustrates a cross-sectional view representing an operation in a dicing process for a portion of the state-of-the-art DRAM wafer of FIG. 2A. Referring to FIG. 2B, a mask layer is disposed above the structure of FIG. 2A. Laser scribing is performed to provide a trench between the bump/solder balls to provide an opened trench. Plasma etching may then be performed through the trench for wafer dicing.

By contrast to FIGS. 2A and 2B, FIGS. 3A-3E illustrate cross-sectional views of a portion of a new DRAM wafer 350 including a plurality of DRAM chips (integrated circuits) during performing of a maskless method of dicing the semiconductor wafer, in accordance with an embodiment of the present invention.

Figure 3A:
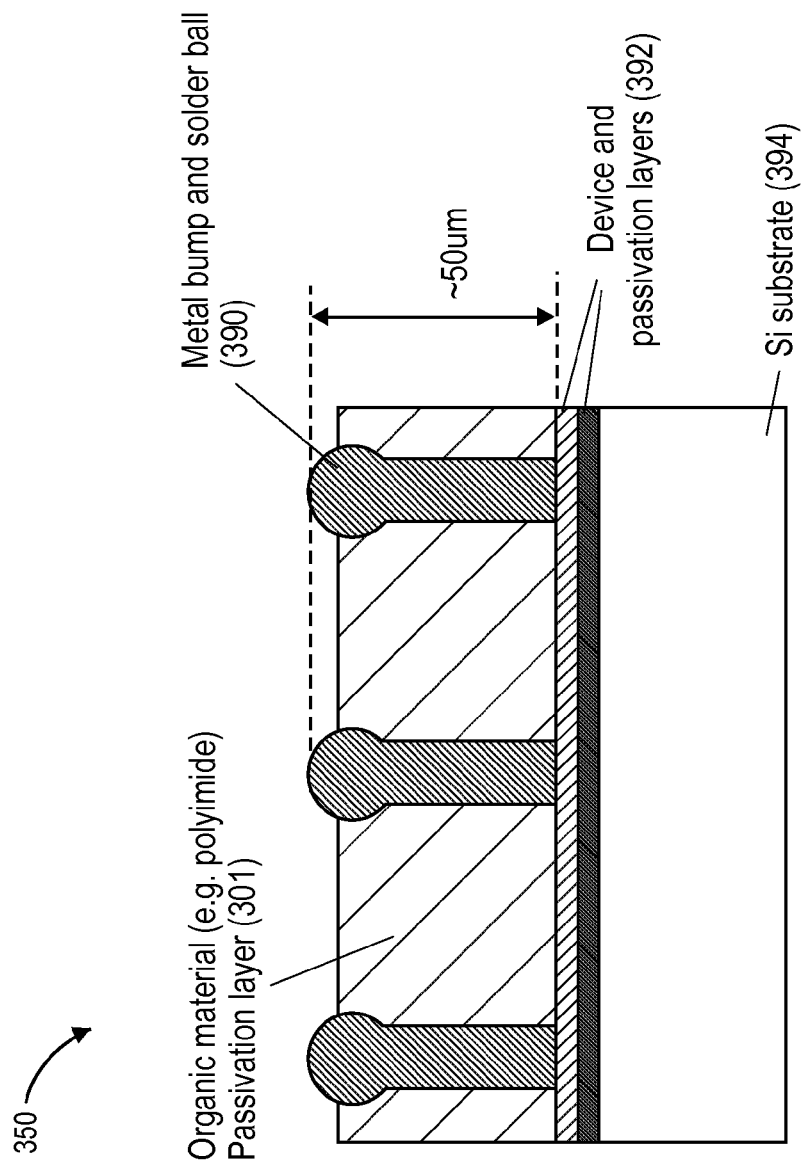
FIG. 3A-3E illustrate cross-sectional view of a semiconductor wafer including a plurality of integrated circuits during performing of a maskless method of dicing the semiconductor wafer, in accordance with an embodiment of the present invention.

Referring to FIG. 3A, wafer 350 includes dies having metal bump/solder ball pairs 390 that are approximately 50 microns or taller. An approximately 35-50 micron organic layer, such as a polyimide layer, is used as a passivation layer 301 between the metal bump/solder ball pairs, exposing only the uppermost portion of these pairs. The passivation layer 301 may be a necessary structural component of the dies. The dies also include device and passivation layers 392, all of which are disposed on a substrate 394, such as a silicon (Si) substrate.

Figure 3B:
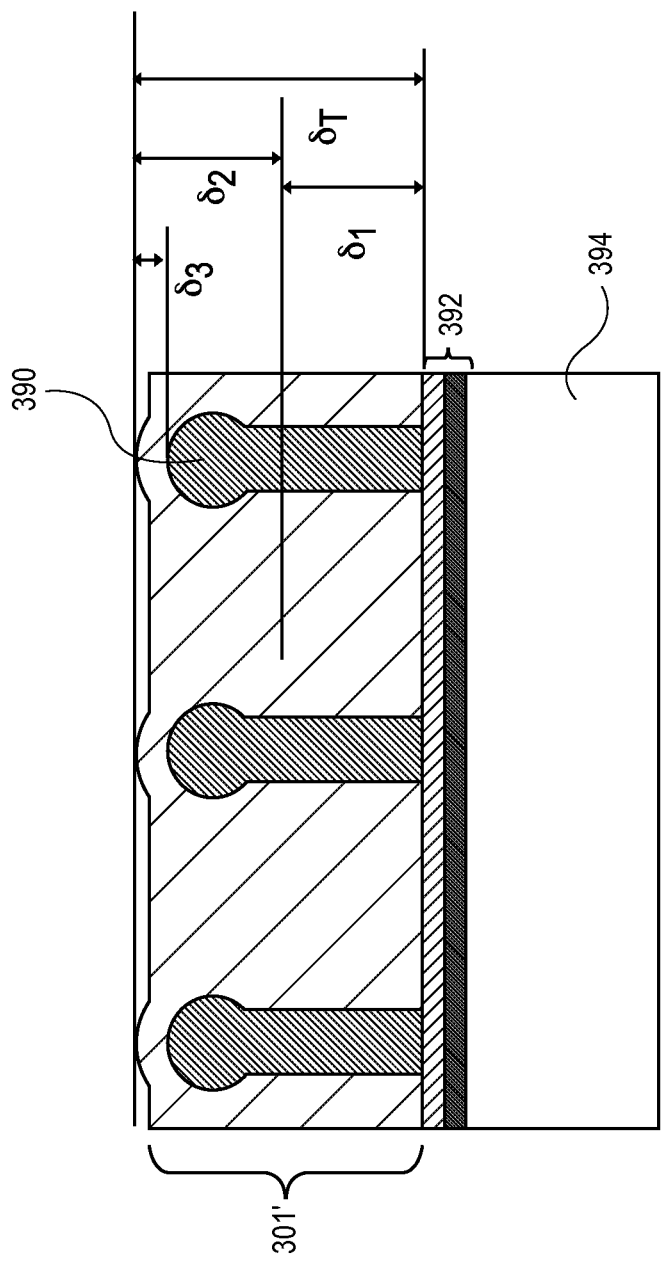

Referring to FIG. 3B, the passivation layer 301 of FIG. 3A is shown as a thicker passivation layer 301' covering and protecting the exposed bump/solder ball pairs 390. Although, in accordance with one embodiment, the thickening of passivation layer 301 to 301' is shown as being step-wise from FIG. 3A to 3B, i.e., additional passivation layer (such as additional polyimide) is added to an already formed film. However, in another embodiment, the initial thickness of the passivation layer is as shown in FIG. 3B, i.e., the initial thickness is of layer 301' which is formed above and covering the exposed bump/solder ball pairs 390. In either case, in an embodiment, the passivation layer is formed by a dry lamination process. Referring again to FIG. 3B, $\delta_T$ represents total film thickness, $\delta_1$ represents target film thickness as a desired final passivation layer thickness, $\delta_2$ represents additional film thickness to be consumed as during plasma dicing and/or ashing, and $\delta_3$ represents the minimum film thickness needed to protect bumps from exposure during dicing.

Figure 3C:
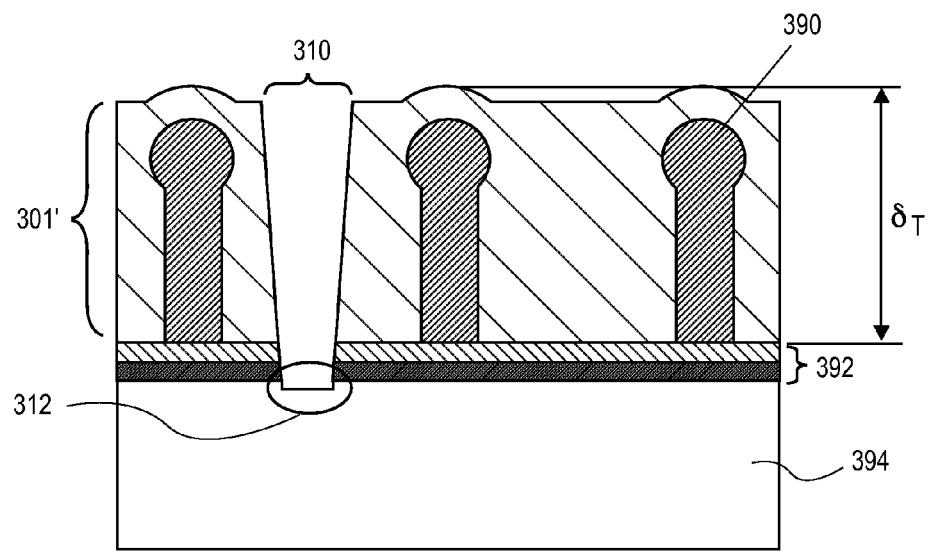

Referring to FIG. 3C, the passivation layer 301' is patterned with a laser scribing process to provide gaps 310. The laser scribing process is also used to scribe the device and passivation layers 392, exposing regions of the substrate 394 between the integrated circuits (i.e., between individual dies). The laser scribing process may be performed along streets (not shown here, but rather described in association with FIG. 6) formed in the device and passivation layers 392. In accordance with an embodiment of the present invention, the laser scribing process further forms trenches 312 partially into the regions of the substrate 394 between the integrated circuits, as depicted in FIG. 3C.

Figure 3D:
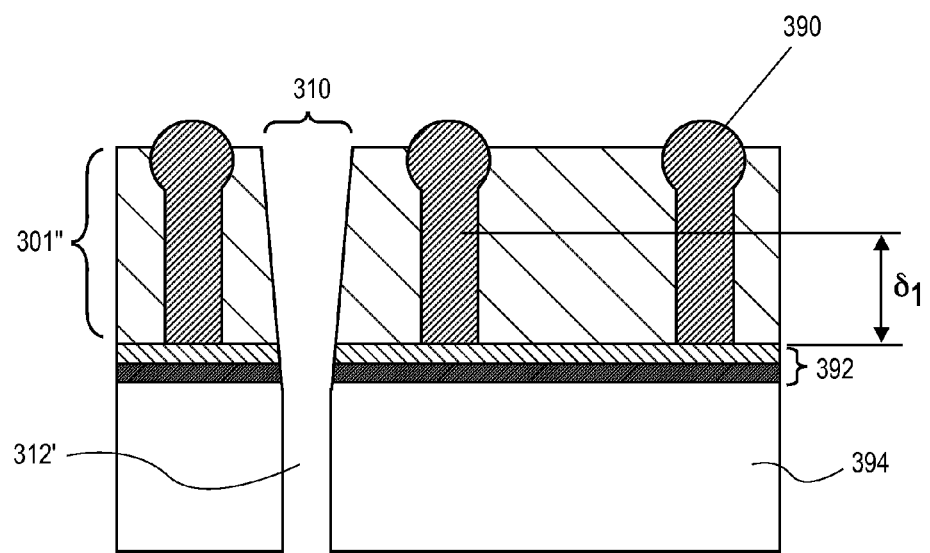

Referring now to FIG. 3D, the wafer 350 is etched through the scribe lines in the patterned passivation layer 301 to singulate the integrated circuits. In accordance with an embodiment of the present invention, etching the wafer 350 includes ultimately etching entirely through the wafer 350, as depicted in FIG. 3D. In one embodiment, the etching is along trenches 312 to extend and form complete trenches 312' through the substrate 394. Referring again to FIG. 3D, the plasma etching also recesses the passivation layer 301' to a reduced thickness 301". In one such embodiment, although recessed somewhat, the remaining polymer thickness 301" is still more than the target passivation layer thickness $\delta_1$.

Figure 3E:
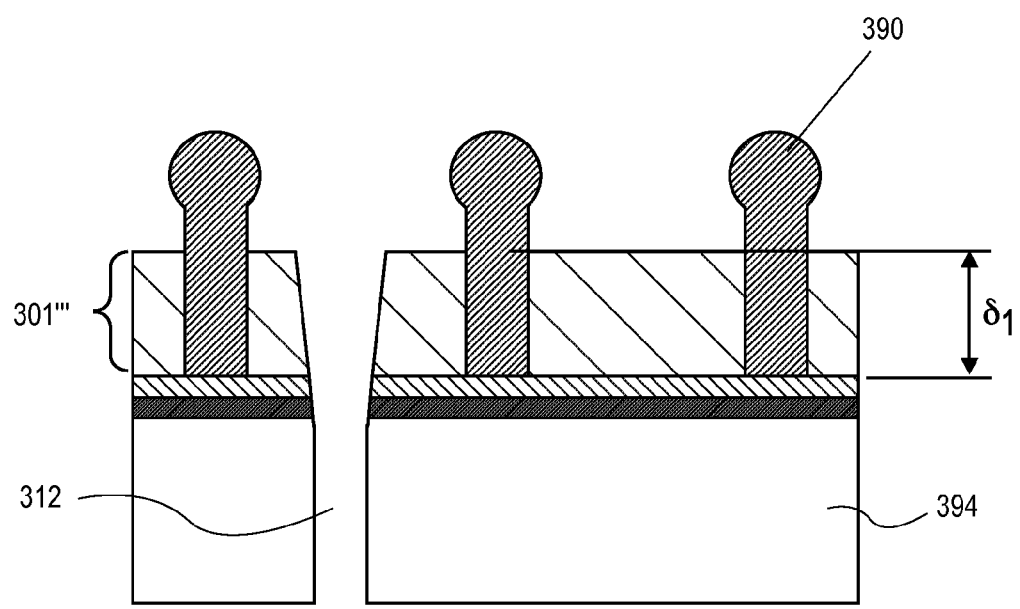

Referring to FIG. 3E, the passivation layer 301" is further thinned to a final passivation layer 301'" having the target value $\delta_1$. In one embodiment, the additional thinning is performed by using a plasma ash process. In a specific such embodiment, the plasma ash process involves ashing with $O_2$ to trim the polymer thickness. Following the plasma ashing process, additional processing may include wafer/die cleaning, die pack, die attach, soldering, etc.

Thus, FIGS. 3A-3E illustrate an embodiment where only a thick passivation layer or molding compound is included on the wafer for dicing. In other embodiment, as described above, in addition to the (e.g., polyimide) molding compound or thick passivation layer, an underfill material layer is included on the molding compound or thick passivation layer. In one such embodiment, the underfill material layer is a dry laminate under-fill material layer. In a specific embodiment, the underfill material layer covers the bumps and thus doubles as an etch mask. The use of the underfill layer as an etch mask may be further be accompanied by a disposable masking layer that is not retained in a final structure or product. However, it is to be appreciated that such a disposable additional mask layer may be optional. As an example, FIG. 4A-4F illustrate cross-sectional view of a semiconductor wafer including a plurality of integrated circuits during performing of a masked method of dicing the semiconductor wafer, in accordance with an embodiment of the present invention.

Figure 4A:
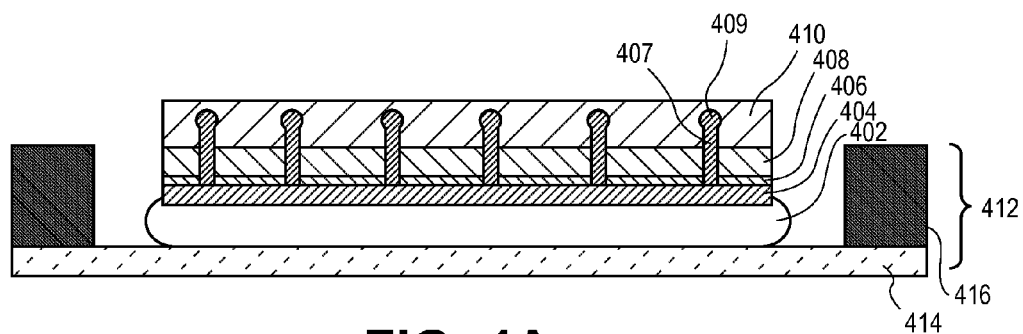
FIG. 4A-4F illustrate cross-sectional view of a semiconductor wafer including a plurality of integrated circuits during performing of a masked method of dicing the semiconductor wafer, in accordance with an embodiment of the present invention.

Referring to FIG. 4A, a wafer 402 is provided on a substrate carrier 412. The wafer 402 may include device layer(s) 404, passivation 406, pillars 407 and corresponding contact bumps 409, molding compound 408, and an under-fill material layer 410. In an embodiment, the molding compound 408 is composed of a polyimide material. In an embodiment, the under-fill material layer 410 is composed of a material that can be formed by a method implemented prior to singulation, e.g., a hot melt material or a dry laminate material. In one such embodiment, however, a method that would otherwise be performed after singulation or after singulated die stacking is not used, e.g., a capillary fill method is not implemented. The wafer 402 may be attached to the substrate carrier 412 which may include a dicing tape 414 and frame 416 assembly, as is depicted in FIG. 4A. In an embodiment, the wafer 402 has been thinned to approximately 30 to 300 microns from an initial approximately 800 microns.

Figure 4B:
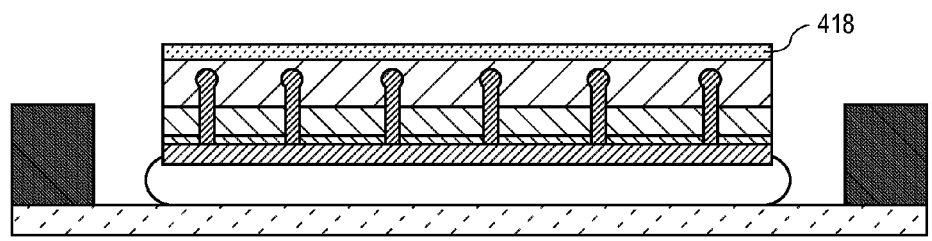

Referring to FIG. 4B, the wafer 402 is coated with a mask layer 418. The mask layer 418 may be a thin layer of a material that is soluble in an appropriate solvent. This thin layer may be referred to as a "laser etch mask" in that it serves the sole purpose of masking the wafer from damaging contaminants from the laser etching process. In an embodiment, a water soluble material mask material is used, such as a poly-vinyl alcohol (PVA), advantages of which may include low cost and easy removability. Other materials may also be appropriate, such as materials soluble in an organic non-polar solvent, e.g., a soft baked non-photosensitive organic resist base. The coating of the mask layer 418 may involve use of one of several methods including spin coating, spray coating, and vacuum lamination, etc. In an embodiment, the mask layer 418 has a thickness sufficiently thick to guarantee that generated debris can be separated physically and chemically from the layer beneath, i.e., the under-fill material layer 410. For example, in an embodiment, large particles ejected by a laser scribing process may be embedded in the thin mask layer and, accordingly, the thin mask layer is suitably thick to prevent the embedded portion of the particle from making contact with the under-fill layer 410. In one such embodiment, the mask layer 418 is approximately 1 micron to 30 microns thick, but may be thicker as required, for particles on the order of a few microns in diameter. The thickness of the "laser etch mask" may also be suitably thick to limit or delay the possible leaching of laser deposited contaminants through the mask and into the under-fill layer 410 until after the laser etch mask has been removed in a later operation. In an embodiment, one to several microns is an appropriate thickness. It is to be appreciated that proper selection of the masking material may also increase leaching time enabling a thinner laser etch mask.

It is to be appreciated that using an under-fill/molding layer as the mask may be sufficient. However, when a laser is to be used as the patterning method, the laser scribe process can leave residue that may not readily be cleaned up in a dry process. In accordance with embodiments herein, a sacrificial laser etch mask has a thickness suitable for promoting its "washability."

In accordance with an embodiment of the present invention, forming the mask 418 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, forming the mask 418 involves forming a layer deposited in a plasma deposition process. For example, in one such embodiment, the mask 418 is composed of a plasma deposited Teflon or Teflon-like (polymeric $CF_2$) layer. In a specific embodiment, the polymeric $CF_2$ layer is deposited in a plasma deposition process involving the gas $C_4F_8$.

In another embodiment, forming the mask 418 involves forming a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, forming the mask 418 involves forming a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

Figure 4C:
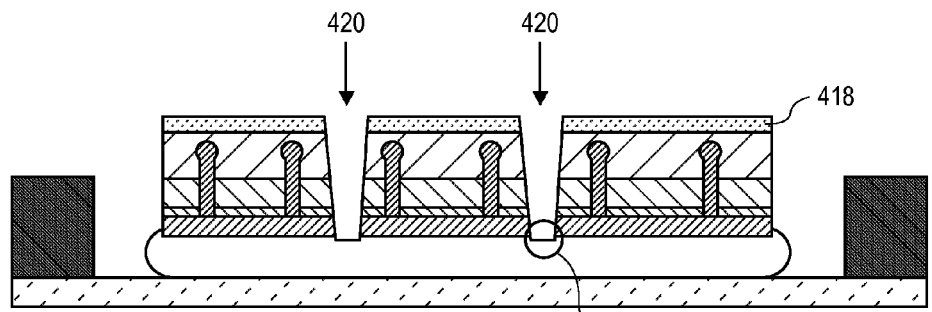

Referring to FIG. 4C, the wafer 402 (including masking layer 418) is patterned by a laser scribing process to form gaps or opening 420. In an embodiment, the laser scribing process involves use of a pulsed laser cold ablation technique. The laser scribing may further generate trenches 422 in the surface of the wafer (typically silicon) which extend from the gaps or openings 420 formed through the laser etch mask 418, the under-fill material layer 410, the molding layer 408, the passivation layer 406, and the device layers 404. In an embodiment, the thinness of the additional laser etch mask 418 is important in this regard since the mask 418 should be removed by the limited power laser. By contrast, a thicker mask layer could adversely impact throughput.

Figure 4D:
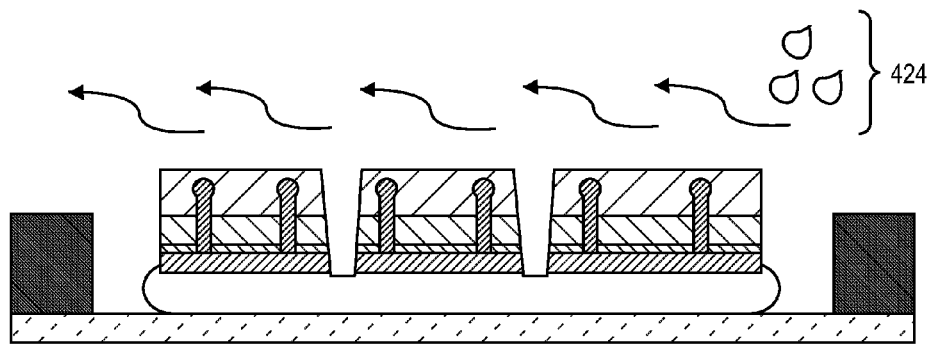

Referring to FIG. 4D, the laser etch mask 418 is removed with appropriate solvent 424. The removal may be accomplished in dedicated equipment such as a spin wash dryer which applies the solvent to the top of the wafer/carrier assembly and then spins the solvent and mask material away. In another embodiment, a suitable cleaning technique involves immersion in a solvent bath followed by rinsing and Maragoni effect isopropyl alcohol (IPA) drying. Alternatively, removal can be accomplished by a dry plasma process if sufficient selectivity to the underfill layer can be achieved.

Figure 4E:
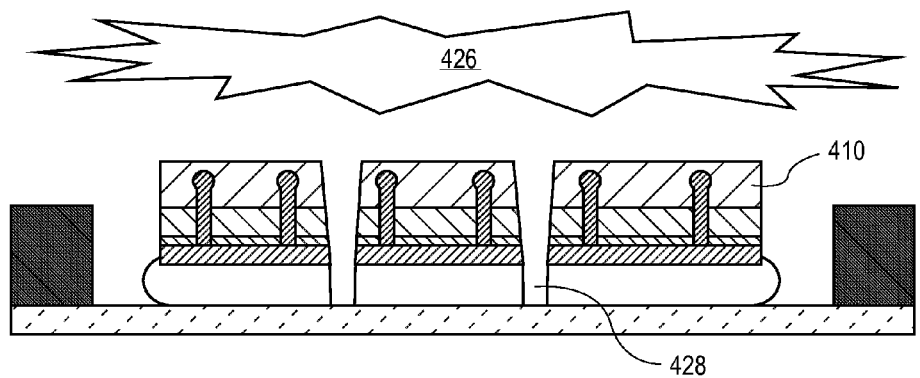

Referring to FIG. 4E, the wafer 402 is plasma etch singulated by loading the wafer/carrier assembly into a plasma etch chamber and plasma etching 426 through the bulk wafer to form trench extensions 428, e.g., by a Bosch etching process. The singulation process is implemented in order to singulate the chips from one another and from the wafer, taking suitable precautions not to over etch through the dicing tape of the wafer/carrier assembly. In an embodiment, the under-fill material layer 410 protects the contacts 409 during the bulk etch cycle and may be partially consumed during the plasma etch operation. In one embodiment, the under-fill material layer 410 has a high resistance to the fluorine etch chemistry of the Bosch process such that consumption of the underfill material layer 410 is minimized at this operation. By selecting an etch resistant underfill material layer 410, the layer need not be excessively thick which might otherwise require a high power laser or long laser etch time or both during the laser scribing process.

Figure 4F:
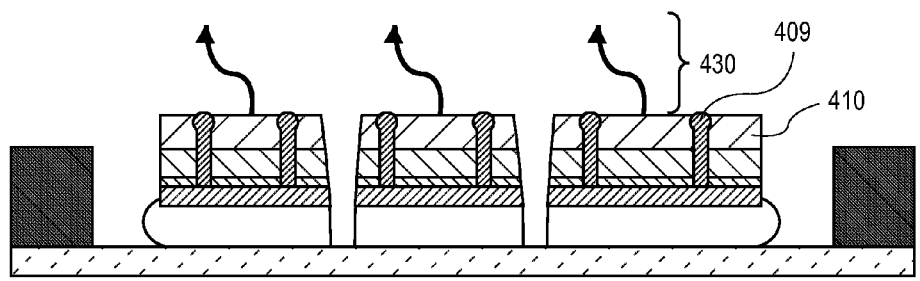

Referring to FIG. 4F, with or without removing the wafer/carrier assembly from the vacuum, and in either the same or separate dedicated chamber located on a vacuum cluster tool, the wafer 402 is exposed to a dry cleaning process 430. In an embodiment, the dry cleaning process involves use of an oxygen plus ammonia ashing plasma process optimized to remove a portion of the under-fill material layer 410 to reveal the contact bumps 409. In one such embodiment, this operation renders the contact bumps 409 clean and free of any contaminants while optimizing the remaining amount of the under-fill material layer 410 for a good quality subsequent die stacking process. In an embodiment, the wafer/carrier assembly 412 is unloaded and the singulated die are ready for picking and stacking.

Referring again to FIGS. 3A-3E and to FIGS. 4A-4F, in an embodiment, the wafer 350 or 402, respectively, is substantially composed of a material suitable to withstand a fabrication process and upon which semiconductor processing layers may suitably be disposed. For example, in one embodiment, semiconductor wafer or substrate is composed of a group IV-based material such as, but not limited to, crystalline silicon (as shown), germanium or silicon/germanium. In a specific embodiment, providing semiconductor wafer includes providing a monocrystalline silicon substrate. In a particular embodiment, the monocrystalline silicon substrate is doped with impurity atoms. In another embodiment, semiconductor wafer or substrate is composed of a material such as, e.g., a material substrate used in the fabrication of light emitting diodes (LEDs).

In an embodiment, the semiconductor wafer has disposed thereon or therein, as a portion of the integrated circuits, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Materials making up the streets may be similar to or the same as those materials used to form the integrated circuits. For example, the streets may be composed of layers of dielectric materials, semiconductor materials, and metallization. In one embodiment, one or more of the streets includes test devices similar to the actual devices of the integrated circuits.

In an embodiment, patterning a thick passivation layer or a stack including a thick passivation layer or molding compound with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the passivation layer or stack, the streets and, possibly, a portion of the Si wafer.

Figure 5:
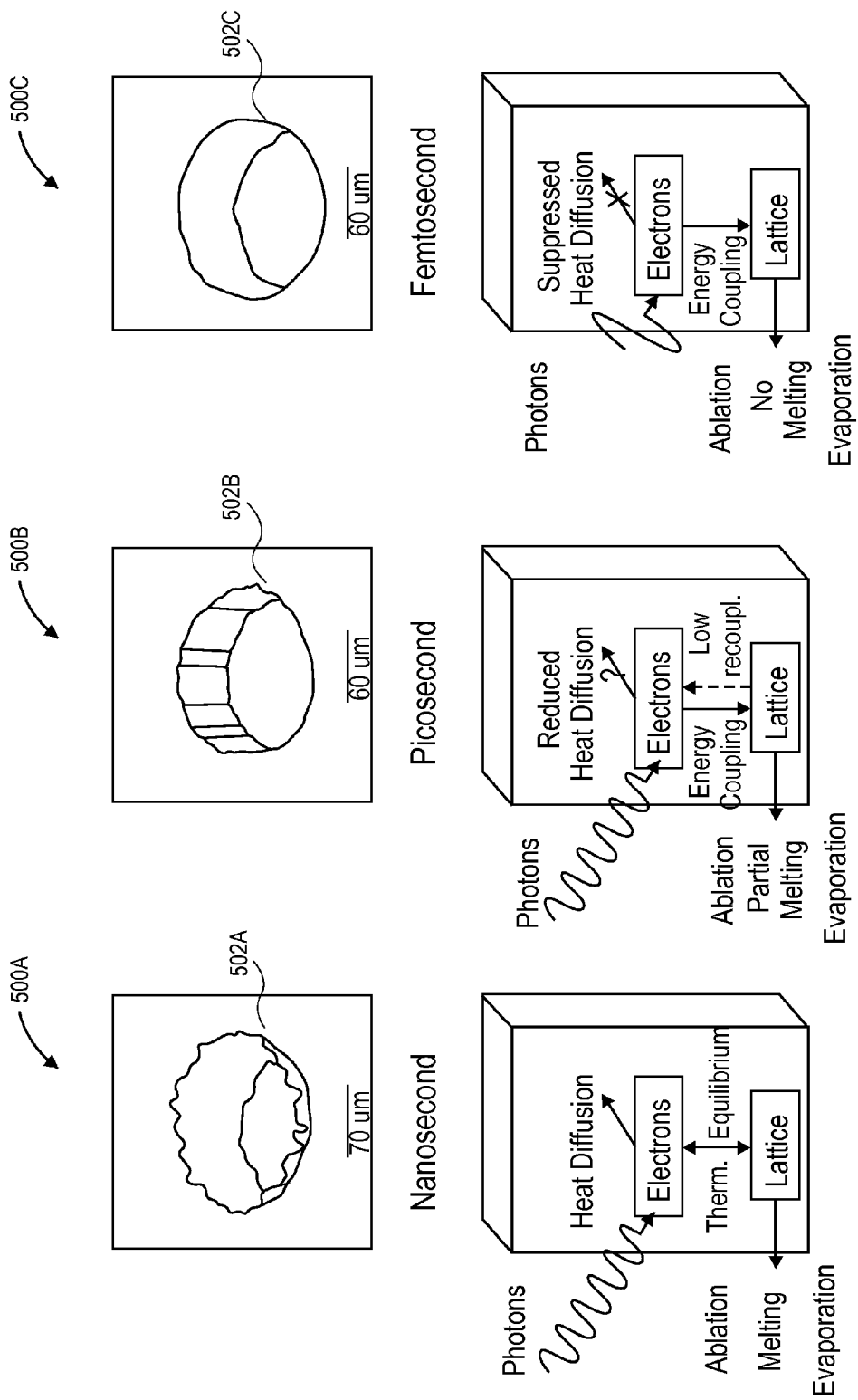
FIG. 5 illustrates the effects of using a laser pulse in the femtosecond range versus longer pulse times, in accordance with an embodiment of the present invention.

FIG. 5 illustrates the effects of using a laser pulse in the femtosecond range versus longer frequencies, in accordance with an embodiment of the present invention. Referring to FIG. 5, by using a laser with a pulse width in the femtosecond range heat damage issues are mitigated or eliminated (e.g., minimal to no damage 502C with femtosecond processing of a via 500C) versus longer pulse widths (e.g., damage 502B with picosecond processing of a via 500B and significant damage 502A with nanosecond processing of a via 500A). The elimination or mitigation of damage during formation of via 500C may be due to a lack of low energy recoupling (as is seen for picosecond-based laser ablation) or thermal equilibrium (as is seen for nanosecond-based laser ablation), as depicted in FIG. 5.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 6 illustrates a cross-sectional view of a stack of materials that may be used in a street region of a semiconductor wafer or substrate, in accordance with an embodiment of the present invention.

Figure 6:
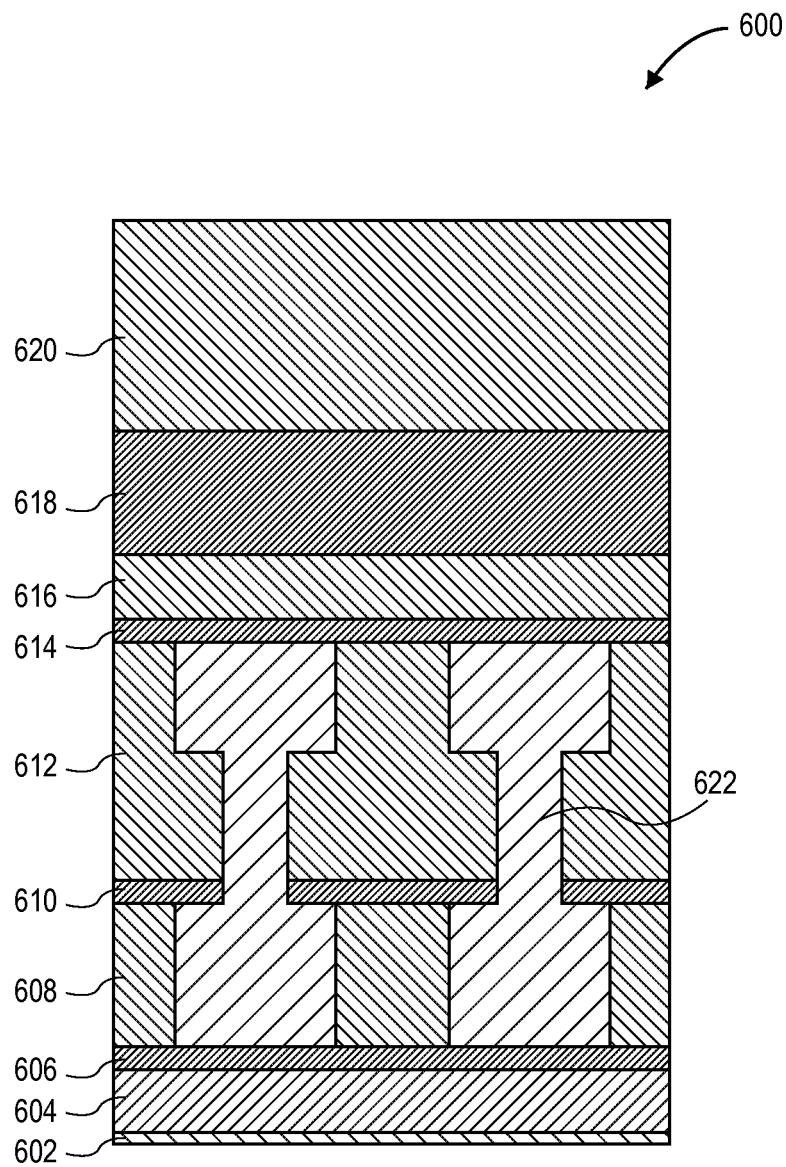
FIG. 6 illustrates a cross-sectional view of a stack of materials that may be used in a street region of a semiconductor wafer or substrate, in accordance with an embodiment of the present invention.

Referring to FIG. 6, a street region 600 includes the top portion 602 of a silicon substrate, a first silicon dioxide layer 604, a first etch stop layer 606, a first low K dielectric layer 608 (e.g., having a dielectric constant of less than the dielectric constant of 4.0 for silicon dioxide), a second etch stop layer 610, a second low K dielectric layer 612, a third etch stop layer 614, an undoped silica glass (USG) layer 616, a second silicon dioxide layer 618, as an exemplary material stack. Referring again to FIG. 6, a very thick passivation layer 620 (such as a greater than 50 micron thick polyimide layer, such as layer 301') may be included, as described above. Alternatively, a masked or maskless stack including a thick passivation layer/molding compound and overlying underfill material layer is included (and represented by 620 in FIG. 6). Copper metallization 622 is disposed between the first and third etch stop layers 606 and 614 and through the second etch stop layer 610. In a specific embodiment, the first, second and third etch stop layers 606, 610 and 614 are composed of silicon nitride, while low K dielectric layers 608 and 612 are composed of a carbon-doped silicon oxide material.

Figures 7, 8:
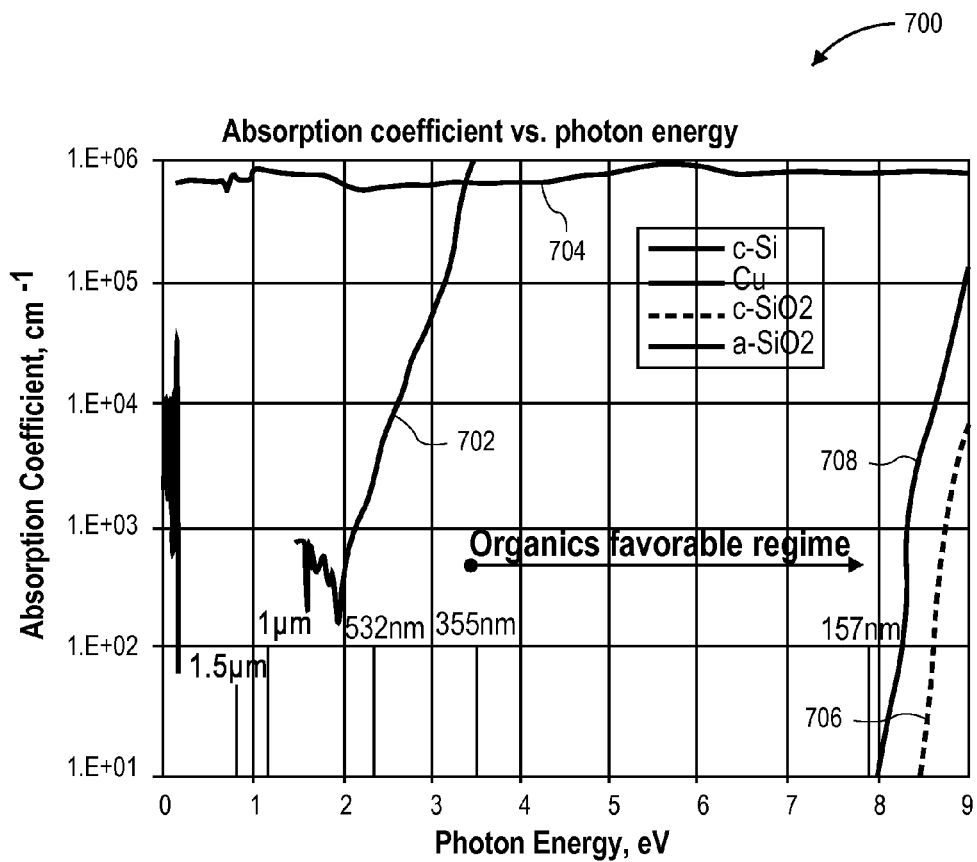
FIG. 7 includes a plot of absorption coefficient as a function of photon energy for crystalline silicon (c-Si), copper (Cu), crystalline silicon dioxide (c-SiO2), and amorphous silicon dioxide (a-SiO2), in accordance with an embodiment of the present invention.
FIG. 8 is an equation showing the relationship of laser intensity for a given laser as a function of laser pulse energy, laser pulse width, and laser beam radius.

Under conventional laser irradiation (such as nanosecond-based or picosecond-based laser irradiation), the materials of street 600 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. For example, FIG. 7 includes a plot 700 of absorption coefficient as a function of photon energy for crystalline silicon (c-Si, 702), copper (Cu, 704), crystalline silicon dioxide (c-SiO2, 706), and amorphous silicon dioxide (a-SiO2, 708), in accordance with an embodiment of the present invention. FIG. 8 is an equation 800 showing the relationship of laser intensity for a given laser as a function of laser pulse energy, laser pulse width, and laser beam radius.

Using equation 800 and the plot 700 of absorption coefficients, in an embodiment, parameters for a femtosecond laser-based process may be selected to have an essentially common ablation effect on the inorganic and organic dielectrics, metals, and semiconductors even though the general energy absorption characteristics of such materials may differ widely under certain conditions. For example, the absorptivity of silicon dioxide is non-linear and may be brought more in-line with that of organic dielectrics, semiconductors and metals under the appropriate laser ablation parameters. In one such embodiment, a high intensity and short pulse width femtosecond-based laser process is used to ablate a stack of layers including a silicon dioxide layer and one or more of an organic dielectric, a semiconductor, or a metal. In a specific embodiment, pulses of approximately less than or equal to 400 femtoseconds are used in a femtosecond-based laser irradiation process to remove a thick polyimide layer or a stack including such a layer (such as a stack including an additional underfill material layer), a street, and a portion of a silicon substrate.

By contrast, if non-optimal laser parameters are selected, in stacked structures that involve two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

The special beam profile at the work surfaces may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring again to FIGS. 3D and 4E, in an embodiment, etching the semiconductor wafer includes using a plasma etching process. In one embodiment, a through-silicon via type etch process is used. For example, in a specific embodiment, the etch rate of the material of semiconductor wafer (e.g., silicon) is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 402 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the subsequent plasma ashing operation to further thin a thick passivation layer is performed in a plasma ash chamber suitable for performing an $O_2$ plasma ash process. In one such embodiment, the chamber is similar to the chamber described for the plasma etch process.

As an intermediate to FIGS. 3C and 3D or to FIGS. 4C and 4D, in accordance with an embodiment of the present invention, an intermediate post laser scribing cleaning operation is performed. In an embodiment, the post laser scribing cleaning operation is a plasma-based cleaning process. In a first example, as described below, the plasma-based cleaning process is reactive to the regions of the wafer 350 or 402 exposed by the laser scribing process. In the case of a reactive plasma-based cleaning process, the cleaning process itself may form or extend trenches in the wafer since the reactive plasma-based cleaning operation is at least somewhat of an etchant for the wafer. In a second, different, example, as is also described below, the plasma-based cleaning process is non-reactive to the regions of the wafer exposed by the laser scribing process.

In accordance with a first embodiment, the plasma-based cleaning process is reactive to exposed regions of the wafer (e.g., a silicon wafer) in that the exposed regions are partially etched during the cleaning process. In one such embodiment, Ar or another non-reactive gas (or the mix) is combined with $SF_6$ for a highly-biased plasma treatment for cleaning of scribed openings. The plasma treatment using mixed gases Ar+$SF_6$ under high-bias power is performed for bombarding mask-opened regions to achieve cleaning of the mask-opened regions. In the reactive breakthrough process, both physical bombardment from Ar and $SF_6$ along with chemical etching due to $SF_6$ and F-ions contribute to cleaning of mask-opened regions. The approach may be suitable for photoresist or plasma-deposited Teflon masks 418, where breakthrough treatment leads to fairly uniform mask thickness reduction and a gentle Si etch. Such a breakthrough etch process, however, may not be best suited for water soluble mask materials.

In accordance with a second embodiment, the plasma-based cleaning process is non-reactive to exposed regions of the wafer (e.g., a silicon wafer) in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks or for thinner plasma-deposited Teflon 418. In another such embodiment, separate mask condensation and scribed trench cleaning operations are used, e.g., an Ar or non-reactive gas (or the mix) highly-biased plasma treatment for mask condensation is first performed, and then an Ar+$SF_6$ plasma cleaning of a laser scribed trench is performed. This embodiment may be suitable for cases where Ar-cleaning is not sufficient for trench cleaning due to too thick of a mask material. Cleaning efficiency is improved for thinner masks, but mask etch rate is much lower, with almost no consumption in a subsequent deep silicon etch process. In yet another such embodiment, three-operation cleaning is performed: (a) Ar or non-reactive gas (or the mix) highly-biased plasma treatment for mask condensation, (b) Ar+$SF_6$ highly-biased plasma cleaning of laser scribed trenches, and (c) Ar or non-reactive gas (or the mix) highly-biased plasma treatment for mask condensation. In accordance with another embodiment of the present invention, a plasma cleaning operation involves first use of a reactive plasma cleaning treatment. The reactive plasma cleaning treatment is then followed by a non-reactive plasma cleaning.

Accordingly, referring again to FIGS. 3A-3E and to FIGS. 4A-4F, wafer dicing may be preformed by initial laser ablation through a mask layer, through wafer streets (including metallization), and partially into a silicon substrate. The laser pulse width may be selected in the femto-second range. Die singulation may then be completed by subsequent through-silicon deep plasma etching. A thick passivation layer, or an overlying underfill material layer, of the integrated circuits may then be thinned to exposed portions of bumps/pillars. The singulation process may further include patterning a die attach film, exposing a top portion of a backing tape and singulating the die attach film. In an embodiment, the die attach film is singulated by a laser process or by an etch process. Further embodiments may include subsequently removing the singulated portions of substrate (e.g., as individual integrated circuits) from the backing tape. In one embodiment, the singulated die attach film is retained on the back sides of the singulated portions of substrate. In an embodiment, the singulated integrated circuits are removed from the backing tape for packaging. In one such embodiment, a patterned die attach film is retained on the backside of each integrated circuit and included in the final packaging. However, in another embodiment, the patterned die attach film is removed during or subsequent to the singulation process. In an alternative embodiment, in the case that the substrate is thinner than approximately 50 microns, the laser ablation process is used to completely singulate the substrate without the use of an additional plasma process.

A single process tool may be configured to perform many or all of the operations in a hybrid laser ablation and plasma etch singulation process. For example, FIG. 9 illustrates a block diagram of a tool layout for laser and plasma dicing of wafers or substrates, in accordance with an embodiment of the present invention.

Figure 9:
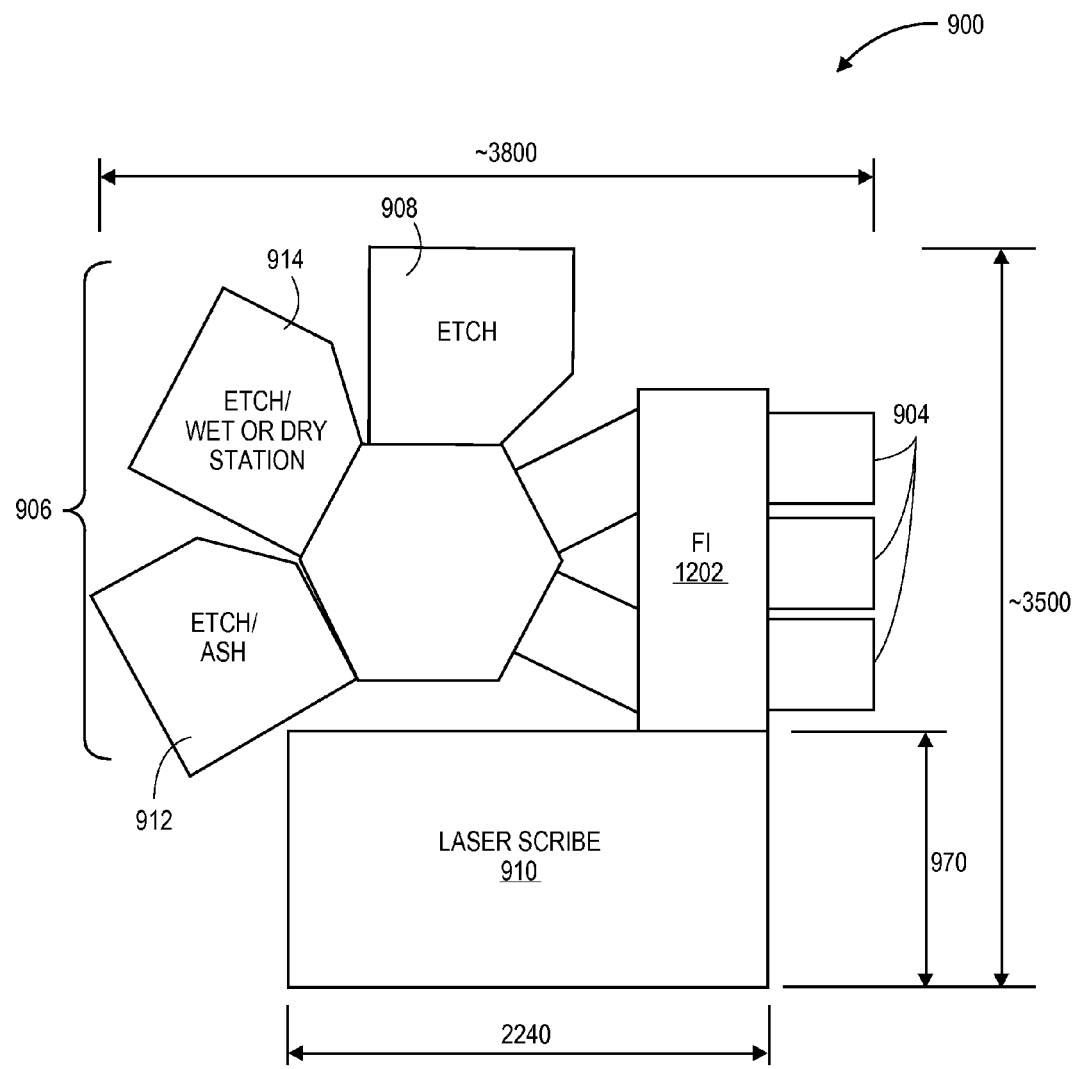
FIG. 9 illustrates a block diagram of a tool layout for laser and plasma dicing of wafers or substrates, in accordance with an embodiment of the present invention.

Referring to FIG. 9, a process tool 900 includes a factory interface 902 (FI) having a plurality of load locks 904 coupled therewith. A cluster tool 906 is coupled with the factory interface 902. The cluster tool 906 includes one or more plasma etch chambers, such as plasma etch chamber 908. A laser scribe apparatus 910 is also coupled to the factory interface 902. The overall footprint of the process tool 900 may be, in one embodiment, approximately 3500 millimeters (3.5 meters) by approximately 3800 millimeters (3.8 meters), as depicted in FIG. 9.

In an embodiment, the laser scribe apparatus 910 houses a femto-second-based laser. The femtosecond-based laser is suitable for performing a laser ablation portion of a hybrid laser and etch singulation process, such as the laser abalation processes described above. In one embodiment, a moveable stage is also included in laser scribe apparatus 900, the moveable stage configured for moving a wafer or substrate (or a carrier thereof) relative to the femtosecond-based laser. In a specific embodiment, the femtosecond-based laser is also moveable. The overall footprint of the laser scribe apparatus 910 may be, in one embodiment, approximately 2240 millimeters by approximately 1270 millimeters, as depicted in FIG. 9. It is to be understood, however, in other embodiments, a nano- or pico-second based laser is used.

In an embodiment, the one or more plasma etch chambers 908 is configured for etching a wafer or substrate through the gaps in a patterned mask to singulate a plurality of integrated circuits. In one such embodiment, the one or more plasma etch chambers 908 is configured to perform a deep silicon etch process. In a specific embodiment, the one or more plasma etch chambers 1208 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 908 to facilitate high silicon etch rates. In an embodiment, more than one etch chamber is included in the cluster tool 906 portion of process tool 900 to enable high manufacturing throughput of the singulation or dicing process. For example, in one such embodiment, as dedicated plasma ash chamber 912 is included, as depicted. The plasma ash chamber may be used for thinning a thick passivation layer or molding compound or for thinning an overlying underfill material layer disposed thereon.

The factory interface 902 may be a suitable atmospheric port to interface between an outside manufacturing facility with laser scribe apparatus 910 and cluster tool 906. The factory interface 902 may include robots with arms or blades for transferring wafers (or carriers thereof) from storage units (such as front opening unified pods) into either cluster tool 906 or laser scribe apparatus 910, or both.

Cluster tool 906 may include other chambers suitable for performing functions in a method of singulation. For example, in one embodiment, in place of an additional etch chamber, a wet/dry station 914 is included. The wet/dry station may be suitable for cleaning residues and fragments (and, possibly, for mask removal) subsequent to a laser scribe and plasma etch/ash singulation process of a substrate or wafer. In an embodiment, a metrology station is also included as a component of process tool 900.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 900 described in association with FIG. 9. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 10:
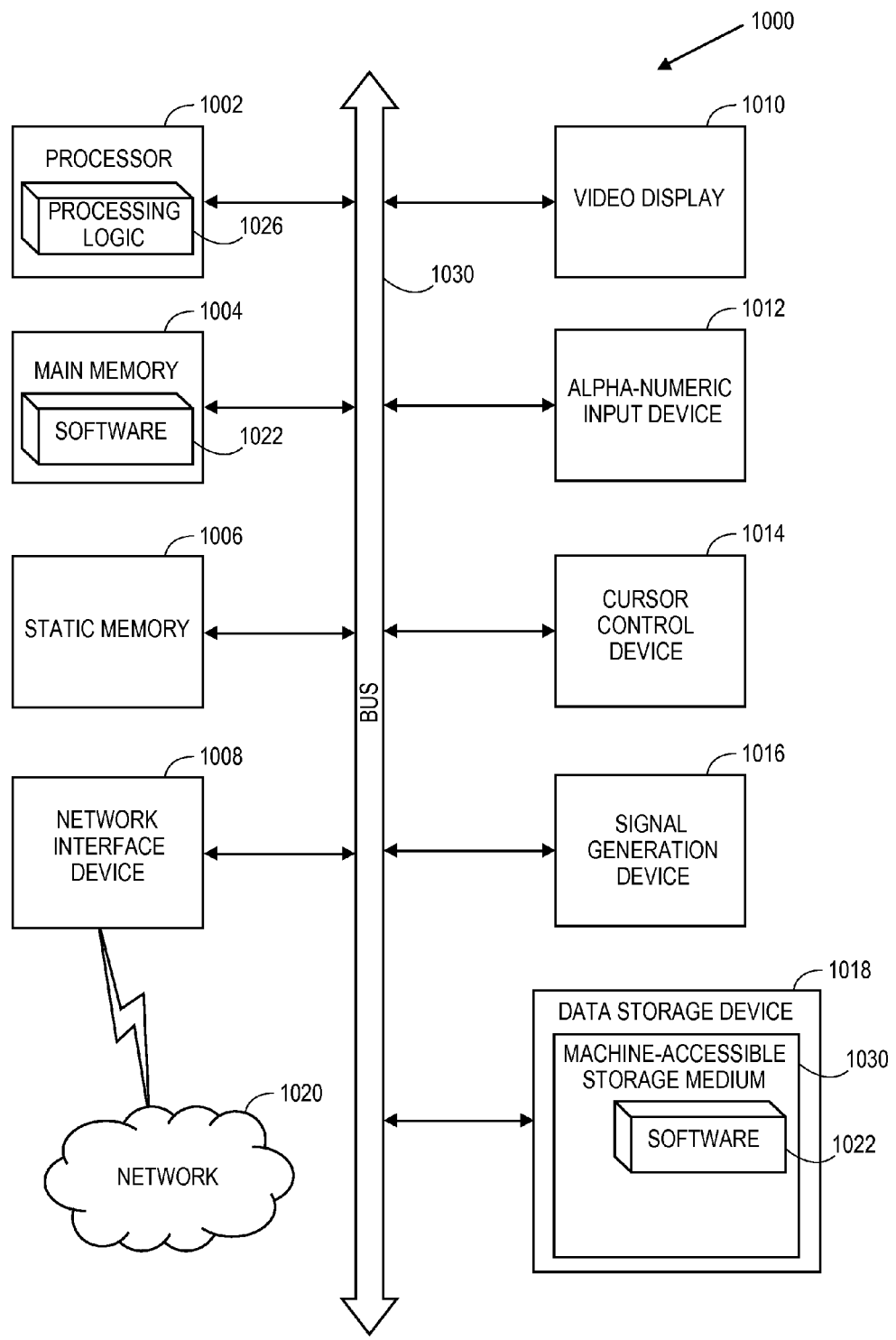
FIG. 10 illustrates a block diagram of an exemplary computer system, in accordance with an embodiment of the present invention.

FIG. 10 illustrates a diagrammatic representation of a machine in the exemplary form of a computer system 1000 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1031 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a front surface having a plurality of integrated circuits thereon. The method involves forming a first insulating layer between lower portions of metal pillar/solder bump pairs of the integrated circuits. The method also involves forming a second insulating layer on the first insulating layer, between and covering upper portions of the metal pillar/solder bump pairs. The method also involves laser scribing the first and second insulating layers to provide scribe lines exposing portions of the semiconductor wafer between the integrated circuits. The method also involves plasma etching the semiconductor wafer through the scribe lines to singulate the integrated circuits, wherein the second insulating layer protects the integrated circuits during at least a portion of the plasma etching. The method also involves, subsequent to the plasma etching, thinning but not removing the second insulating layer to partially expose the metal pillar/solder bump pairs of the integrated circuits.

Thus, approaches for cleaning a wafer during hybrid laser scribing and plasma etching wafer dicing processes have been disclosed.

What is claimed is:

1. A method of dicing a semiconductor wafer comprising a front surface having a plurality of integrated circuits thereon, the method comprising:
   forming an underfill material layer between and covering metal pillar/solder bump pairs of the integrated circuits;
   forming a mask layer on the underfill material layer;
   laser scribing mask layer and the underfill material layer to provide scribe lines exposing portions of the semiconductor wafer between the integrated circuits;
   removing the mask layer;
   subsequent to removing the mask layer, plasma etching the semiconductor wafer through the scribe lines to singulate the integrated circuits, wherein a second insulating layer protects the integrated circuits during at least a portion of the plasma etching; and
   subsequent to the plasma etching, thinning but not removing the underfill material layer to partially expose the metal pillar/solder bump pairs of the integrated circuits.

2. The method of claim 1, wherein the mask layer is a water-soluble layer, and wherein removing the mask layer comprising using an aqueous-based treatment.

3. The method of claim 1, wherein the mask layer has a thickness approximately in the range of 1-30 microns.

4. The method of claim 1, wherein laser scribing the underfill material layer and the mask layer comprises using a femto-second-based laser scribing process.

5. The method of claim 1, wherein laser scribing the underfill material layer and the mask layer comprises forming trenches in the semiconductor wafer, each trench having a width, and wherein plasma etching the semiconductor wafer through the scribe lines comprises plasma etching through the trenches to form trench extensions, each trench extension having the width.

6. A method of dicing a semiconductor wafer comprising a front surface having a plurality of integrated circuits thereon, the method comprising:
   forming a first insulating layer between lower portions of metal pillar/solder bump pairs of the integrated circuits;
   forming a second insulating layer on the first insulating layer, between and covering upper portions of the metal pillar/solder bump pairs;
   laser scribing the first and second insulating layers to provide scribe lines exposing portions of the semiconductor wafer between the integrated circuits;
   plasma etching the semiconductor wafer through the scribe lines to singulate the integrated circuits, wherein the second insulating layer protects the integrated circuits during at least a portion of the plasma etching; and
   subsequent to the plasma etching, thinning but not removing the second insulating layer to partially expose the metal pillar/solder bump pairs of the integrated circuits.

7. The method of claim 6, further comprising:
   prior to laser scribing the first and second insulating layers, forming a mask layer on the second insulating layer, wherein the laser scribing provides the scribe lines in the mask layer; and
   subsequent to laser scribing but prior to plasma etching, removing the mask layer.

8. The method of claim 7, wherein the mask layer is a water-soluble layer, and wherein removing the mask layer comprising using an aqueous-based treatment.

9. The method of claim 7, wherein the mask layer has a thickness approximately in the range of 1-30 microns.

10. The method of claim 6, wherein forming the first insulating layer comprises forming a molding compound, and wherein forming the second insulating layer comprises forming an underfill material layer.

11. The method of claim 6, wherein forming the first insulating layer comprises forming a thick polyimide passivation layer, and wherein forming the second insulating layer comprises forming an underfill material layer.

12. The method of claim 6, wherein laser scribing the first and second insulating layers comprises using a femto-second-based laser scribing process.

13. The method of claim 6, wherein thinning the second insulating layer comprises using an oxygen plus ammonia plasma ashing process.

14. The method of claim 6, wherein laser scribing the first and second insulating layers comprises forming trenches in the semiconductor wafer, each trench having a width, and wherein plasma etching the semiconductor wafer through the scribe lines comprises plasma etching through the trenches to form trench extensions, each trench extension having the width.

15. A method of dicing a semiconductor wafer comprising a front surface having a plurality of integrated circuits thereon, the method comprising:
   providing the semiconductor wafer having a first insulating layer disposed between lower portions of metal pillar/solder bump pairs of the integrated circuits, having a second insulating layer disposed on the first insulating layer, between and covering upper portions of the metal pillar/solder bump pairs, and having scribe lines disposed in the first and second insulating layers exposing portions of the semiconductor wafer between the integrated circuits;
   plasma etching the semiconductor wafer through the scribe lines to singulate the integrated circuits, wherein the second insulating layer protects the integrated circuits during at least a portion of the plasma etching; and
   subsequent to the plasma etching, thinning but not removing the second insulating layer to partially expose the metal pillar/solder bump pairs of the integrated circuits.

16. The method of claim 15, wherein providing the semiconductor wafer further comprises providing the semiconductor wafer having a mask layer disposed on the second insulating layer, wherein the scribe lines are also disposed in the mask layer, the method further comprising:
   prior to plasma etching, removing the mask layer.

17. The method of claim 16, wherein the mask layer is a water-soluble layer, and wherein removing the mask layer comprising using an aqueous-based treatment.

18. The method of claim 15, wherein the first insulating layer comprises a molding compound, and wherein the second insulating layer comprises an underfill material layer.

19. The method of claim 15, wherein thinning the second insulating layer comprises using an oxygen plus ammonia plasma ashing process.

* * * * *